(12) United States Patent
J et al.

(10) Patent No.: US 11,967,965 B2
(45) Date of Patent: Apr. 23, 2024

(54) GENERATING DIVIDED SIGNALS FROM PHASE-LOCKED LOOP (PLL) OUTPUT WHEN REFERENCE CLOCK IS UNAVAILABLE

(71) Applicant: Shaoxing Yuanfang Semiconductor Co., Ltd., Shaoxing (CN)

(72) Inventors: Raja Prabhu J, Bangalore (IN); Ankit Seedher, Bangalore (IN); Srinath Sridharan, Bangalore (IN); Rakesh Kumar Gupta, Bangalore (IN); Nitesh Naidu, Bangalore (IN); Shivam Agrawal, Bangalore (IN); Jeevabharathi G, Bangalore (IN); Purva Choudhary, Bangalore (IN)

(73) Assignee: Shaoxing Yuanfang Semiconductor Co., Ltd., Zhejiang (CN)

( * ) Notice: Subject to any disclaimer, the term of this patent is extended or adjusted under 35 U.S.C. 154(b) by 0 days.

(21) Appl. No.: 17/806,735

(22) Filed: Jun. 14, 2022

(65) Prior Publication Data
US 2023/0136353 A1 May 4, 2023

(30) Foreign Application Priority Data
Nov. 3, 2021 (IN) .............................. 202141050628

(51) Int. Cl.
*H03L 7/199* (2006.01)
*H03L 7/081* (2006.01)
(Continued)

(52) U.S. Cl.
CPC ............ *H03L 7/199* (2013.01); *H03L 7/0818* (2013.01); *H03L 7/1976* (2013.01); *H03L 7/24* (2013.01)

(58) Field of Classification Search
CPC ..... G06F 1/04; G06F 1/06; G06F 1/08; G06F 1/10; G06F 1/12; G06F 1/14; H03L 7/14; H03L 7/08; H03L 7/06
See application file for complete search history.

(56) References Cited

U.S. PATENT DOCUMENTS

| | | | |
|---|---|---|---|
| 5,207,491 | A | 5/1993 | Rottinghaus |
| 5,638,410 | A | 6/1997 | Kuddes |

(Continued)

FOREIGN PATENT DOCUMENTS

| | | |
|---|---|---|
| EP | 0315489 A2 | 5/1989 |
| JP | 2000278126 A | 10/2000 |
| WO | WO2017189160 A1 | 9/2016 |

OTHER PUBLICATIONS

Si5345/44/42 Rev D Data Sheet, http://www.mouser.com/ds/2/368/Si5345-44-42-D-DataSheet-968622.pdf, downloaded circa Sep. 12, 2017, 61 pages.

(Continued)

*Primary Examiner* — Diana J. Cheng
(74) *Attorney, Agent, or Firm* — IPHORIZONS PLLC; Narendra Reddy Thappeta

(57) ABSTRACT

Clock generation circuit generating multiple divided signals satisfying respective desired offsets. A phase locked loop (PLL) is used to generate a PLL output having a frequency which is a desired multiple of that of a reference clock. The circuit divides the PLL output by a corresponding divisor to generate a corresponding divided signal, wherein each divided signal is offset from a common reference by at least an associated desired time offset. The common reference is timed with respect to the reference clock when the reference clock is available and with respect to a time reference signal otherwise. This arrangement is extended to use the internal time reference signal even for the cases where the reference clock is present by blocking the reference clock while the (Continued)

output systems across PLLs are aligned using the internal time reference signal to ensure desired offsets across different PLLs with a small uncertainty.

13 Claims, 7 Drawing Sheets

(51) Int. Cl.
*H03L 7/197* (2006.01)
*H03L 7/24* (2006.01)

(56) References Cited

U.S. PATENT DOCUMENTS

| | | | |
|---|---|---|---|
| 5,648,964 | A | 7/1997 | Inagaki et al. |
| 5,740,211 | A | 4/1998 | Bedrosian |
| 6,144,674 | A | 11/2000 | Peres et al. |
| 6,362,670 | B1 | 3/2002 | Beaulieu |
| 6,366,146 | B2 | 4/2002 | Fredriksson |
| 6,570,454 | B2 | 5/2003 | Skierszkan |
| 6,664,827 | B2 | 12/2003 | O'Leary et al. |
| 6,741,109 | B1 | 5/2004 | Huang et al. |
| 6,806,751 | B2 | 10/2004 | Helfinstine |
| 7,064,620 | B1 | 6/2006 | Lai et al. |
| 7,126,432 | B2 | 10/2006 | Roubadia et al. |
| 7,236,040 | B2 | 6/2007 | Chan et al. |
| 7,369,002 | B2 | 5/2008 | Spijker et al. |
| 7,405,628 | B2 | 7/2008 | Hulfachor et al. |
| 7,719,368 | B1 | 5/2010 | Smith et al. |
| 7,893,736 | B2 | 2/2011 | Palmer et al. |
| 7,965,115 | B2 | 6/2011 | Jin |
| 8,509,370 | B2 | 8/2013 | Bhagavatheeswaran et al. |
| 9,007,105 | B2 | 4/2015 | Jenkins |
| 9,362,924 | B1 | 6/2016 | Xu et al. |
| 9,602,113 | B2 | 3/2017 | Galton et al. |
| 9,628,094 | B2 | 4/2017 | Lotfy et al. |
| 10,158,364 | B1 | 12/2018 | Tsai et al. |
| 10,243,573 | B1 | 3/2019 | Goyal et al. |
| 10,514,720 | B1 | 12/2019 | J et al. |
| 10,644,869 | B2 | 5/2020 | Tsai et al. |
| 2003/0133522 | A1 | 7/2003 | Staszewski et al. |
| 2007/0254600 | A1 | 11/2007 | Ishii |
| 2007/0285177 | A1 | 12/2007 | Werker |
| 2008/0002801 | A1 | 1/2008 | Droege et al. |
| 2008/0150597 | A1 | 6/2008 | Hu et al. |
| 2009/0085620 | A1* | 4/2009 | May .................. G06F 1/06 327/156 |
| 2021/0111724 | A1 | 4/2021 | Jung et al. |

OTHER PUBLICATIONS

82P33731 Datasheet, https://www.idt.com/document/dst/82p33731-datasheet, downloaded circa Sep. 13, 2017, 65 pages.

AD9547 Data Sheet, Dual/Quad Input Network Clock Generator/Synchronizer, http://www.analog.com/media/en/technical-documentation/data-sheets/AD9547.pdf, downloaded circa Sep. 19, 2017, 61 pages.

Snaa208 Using the LMK0480x/LMK04906 for Hitless Switching and Holdover, http://www.ti.com/lit/an/snaa208/snaa208.pdf, date Jul. 12, 2013, 13 pages.

CS8525 LC/P Line Card Protection Switch for SONET/SDH Systems, http://www.semtech.com/images/datasheet/acs8525.pdf, downloaded circa Sep. 8, 2017, 65 pages.

Slobodan Milijevic, The basics of synchronized Ethernet, Data Transmission, date Apr. 21, 2009, 04 pages.

D.C. Wei, et al., A monolithic low-bandwidth jitter-cleaning PLL with hitless switching for SONET/SDH clock generation, 2006 IEEE International Solid State Circuits Conference—Digest of Technical Papers, Date of Conference: Feb. 6-9, 2006, 2 pages.

MAX 10 Clocking and PLL User Guide, https://www.intel.com/content/dam/www/programmable/US/en/pdfs/literature/hb/max-10/archives/ug-m10-clkpll-15.1.pdf, Nov. 2, 2015, 72 Pages.

Sheng Ye, et al, A Multiple-Crystal Interface PLL with VCO Realignment to Reduce Phase Noise, 2002 IEEE International Solid-State Circuits Conference. Digest of Technical Papers, Date of Conference: Feb. 7-7, 2002, 03 Pages, IEEE, San Francisco, CA, USA.

Liang Wang, et al, A Novel Phase-Locked Loop Based on Frequency Detector and Initial Phase Angle Detector, IEEE Transactions on Power Electronics ( vol. 28, Issue: 10, Oct. 2013), Date of Publication: Dec. 28, 2012, 11 Pages, IEEE.

Dramatically Improve Your Lock Time with VCO Instant Calibration, https://www.ti.com/lit/an/snaa342/snaa342.pdf?ts=1637913867099&ref_url=https%253A%252F%252Fwww.google.com%252F, Sep. 2020, 12 Pages.

Streamline RF Synthesizer VCO Calibration and OptimizePLL Lock Time, https://www.ti.com/lit/an/snaa336a/snaa336a.pdf?ts=1637914131915&ref_url=https%253A%252F%252Fwww.google.com%252F, Jan. 2020, 18 pages.

Hae-Soo Jeon, et al, Fast Frequency Acquisition All-Digital PLL Using PVT Calibration, 2008 IEEE International Symposium on Circuits and Systems (ISCAS), Date of Conference: May 18-21, 2008, pp. 2625-2628, IEEE, Seattle, WA, USA.

Doug La Porte, "Multi-Part Clock Synchronization Methods for Large Data Acquisition Systems", Sep. 2017, 34 pages.

CDCE6214-Q1 Ultra-Low Power Clock Generator With One PLL, Four Differential Outputs, Two Inputs, and Internal EEPROM, Oct. 2021, 53 pages.

Timothy Toroni, "Multi-Clock Synchronization", SNAA294—Dec. 2019, 14 pages.

"LMK04832 Ultra Low-Noise JESD204B Compliant Clock Jitter Cleaner With Dual Loop PLLs", SNAS688C—Revised Feb. 2017, 108 pages.

"MAX 10 Clocking and PLL User Guide", Nov. 2, 2015, 72 pages.

"LatticeSC sysCLOCK PLL/DLL User's Guide", Jul. 2012, 46 pages.

* cited by examiner

GENERATING DIVIDED SIGNALS FROM PHASE-LOCKED LOOP (PLL) OUTPUT WHEN REFERENCE CLOCK IS UNAVAILABLE

PRIORITY CLAIM

The instant patent application is related to and claims priority from the co-pending India provisional patent application entitled, "Managing Input to Output Delays Across Single and Multiple PLLs Having the Same Input Clock", Ser. No.: 202141050628, Filed: 3 Nov. 2021, inventors: Raja Prabhu, et al; which is incorporated in its entirety herewith to the extent not inconsistent with the description herein.

BACKGROUND

Technical Field

Embodiments of the present disclosure relate generally to phase-locked loops (PLLs), and more specifically to generating divided signals from phase-locked loop output when reference clock is unavailable.

Related Art

Phase-locked loops (PLLs) are frequently used to generate clock signal(s). A PLL receives an input (reference) clock and generates an output clock (PLL output) locked in phase with the input signal, but at a frequency that is a desired multiple of the frequency of the input clock. PLLs are used in various communication scenarios, as is well known in the relevant arts.

Divided (clock) signals are often generated from PLL outputs, with each divided signal having a time period that is an integral multiple of that of the PLL output. The environments requiring such divided signals often specify a respective phase offset, for example from input clock, that each divided signal is to satisfy.

However, there are often situations when the input clock becomes unavailable. Aspects of the present disclosure are directed to generating divided signals in such situations.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Figure 1:
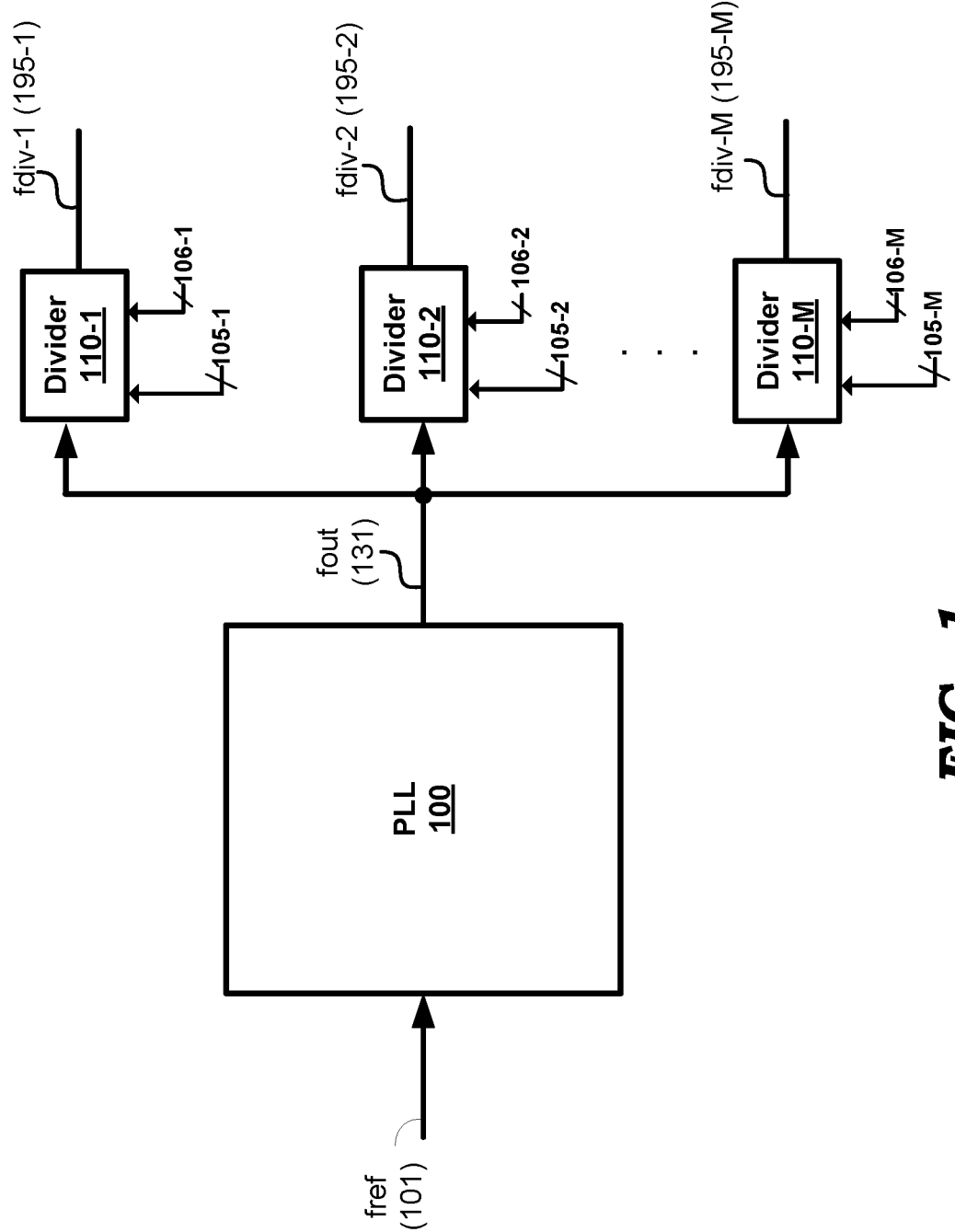
FIG. 1 is a block diagram of an example device in which several aspects of the present disclosure can be implemented.

A clock generation circuit provided according to an aspect of the present disclosure generates multiple divided signals, each satisfying a respective desired offset specified potentially as a specification from an external source. In an embodiment, a phase locked loop (PLL) is used to generate a PLL output having a frequency which is a desired multiple of that of a reference clock. The clock generation circuit receives a corresponding desired time offset for each divided signal.

The clock generation circuit divides the PLL output by a corresponding integer or fractional number (division ratio/divisor) to generate a corresponding divided signal, wherein each divided signal is offset from a common reference by at least the associated desired time offset. The common reference is timed with respect to the reference clock when the reference clock is available and is timed with respect to a time reference signal when the reference clock is not available. The time reference signal is generated external to (i.e., independent of, for example, as not being derived from) the reference clock.

According to another aspect, when the reference clock is available, an edge of each divided signal is timed to the associated time offset immediately after an edge of the PLL output, the edge of the PLL output closely following an edge of the reference clock. When the reference clock is not available, an edge of each divided signal is timed to the associated time offset immediately after an edge of the PLL output, with the edge of the PLL output closely following an edge of the time reference signal. The time reference signal is used similarly for generating all divided signals when the reference clock is not available.

Thus, both when the reference clock is available and not available, a relative phase difference is maintained between the divided signals, as required by an external specification. However, when the reference clock is available, all the divided signals are generated timed with reference to an edge of the reference clock, but further synchronized with the (high frequency) PLL output. Specifically, each divided clock is synchronized with a PLL output edge that closely follows (e.g., one or two PLL output clock cycles) the edge of the reference clock (in addition to satisfying the associated offset requirement). When the reference clock is not available, the time reference signal is substituted for the corresponding function provided by the reference clock.

According to another aspect, the dividing operation may entail counting a number of clock cycles of the PLL output from a first time instance specified satisfying the timing noted above.

According to another aspect a multiplexor is used to select one of the reference clock and the time reference signal as the common reference under the control of a select signal (which indicates whether or not the reference signal is available). A first flip-flop synchronizes a first reset signal with the common reference to generate a first synchronized signal. A second flip-flop synchronizes the first synchronized signal with the PLL output to generate a second synchronized signal and a delay block delays the second synchronized signal by the associated time offset to set the first time instance from which the counting starts.

According to another aspect, the PLL operates in a hold-over mode when the reference clock is not available, wherein the hold-over mode entails the PLL continuing to generate the PLL output without further using the reference clock. Accordingly, the divided signals are generated based on the same timing reference provided by reference clock prior to entering the hold-over mode. However, upon receiving an external reset signal (when the PLL is operating in the hold-over mode), the first reset signal is generated to cause the time reference signal thereafter to control the timing of the divided signals. In an embodiment, the time reference signal is realized in the form of an internal clock signal generated within the clock generation circuit.

Several aspects of the present disclosure are described below with reference to examples for illustration. However, one skilled in the relevant art will recognize that the disclosure can be practiced without one or more of the specific details or with other methods, components, materials and so forth. In other instances, well known structures, materials, or operations are not shown in detail to avoid obscuring the features of the disclosure. Furthermore, the features/aspects described can be practiced in various combinations, though only some of the combinations are described herein for conciseness.

2. Example Component

Figure 2:
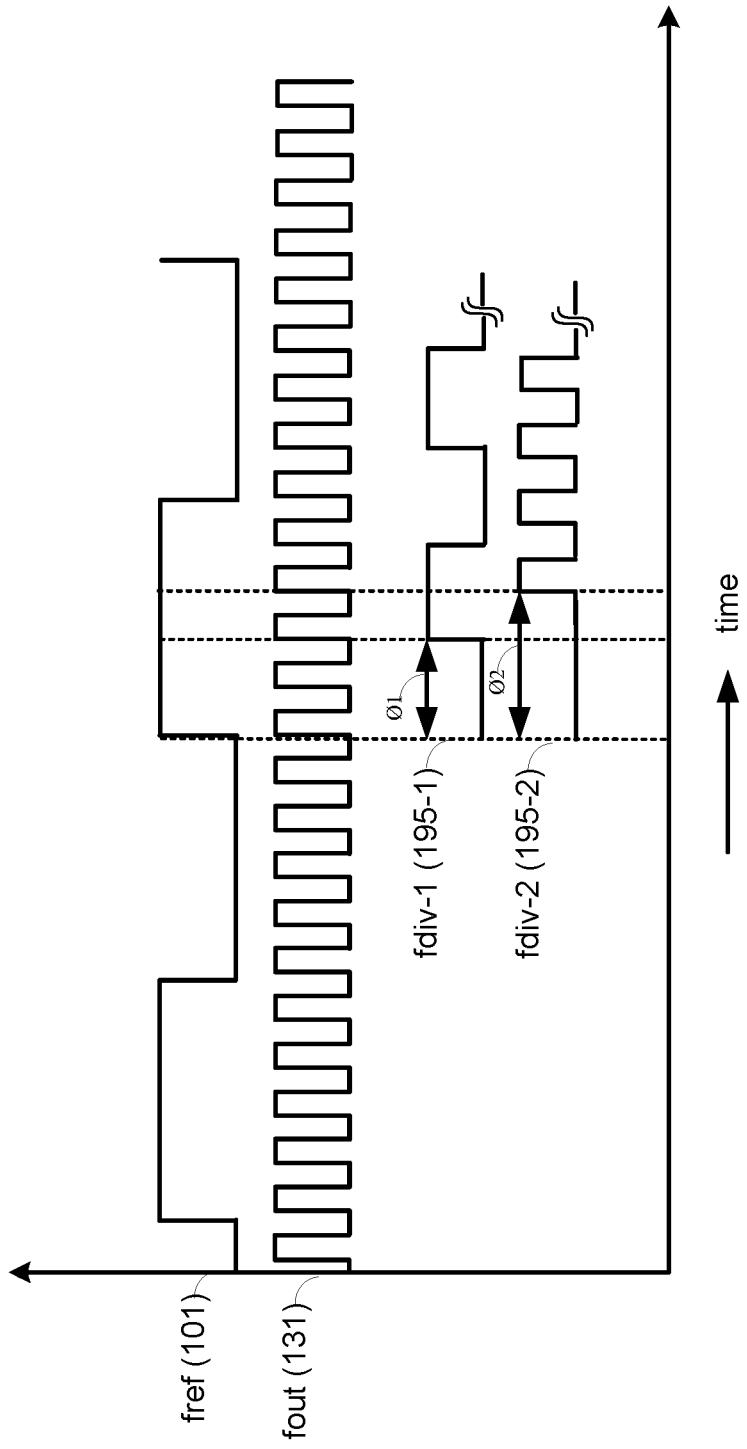
FIG. 2 is a timing diagram illustrating a technique to generate divided signals, in an embodiment of the present disclosure.

FIG. 1 is a block diagram illustrating the details of an example component which can be extended according to several aspects of the present disclosure. The block diagram is shown containing PLL 100 and dividers 110-1 through 110-M, which are explained with respect to the timing diagram of FIG. 2 for conciseness. The dividers will individually or collectively be referred by reference number 110, as will be clear from the context. Similar convention is employed for the respective associated signals also.

PLL 100 is shown receiving an input clock fref 101 and generating PLL output fout 131. PLL 100 may be implemented in a known way. Each divider 110 divides fout 131 by respective ratio 105 received from external sources to generate corresponding divided signal 195.

Each ratio 105 can be an integer or an integer plus a fractional component, and in addition any pair of ratios are required to be related to each other by a fixed ratio. Thus, fout 131 is shown locked to fref 101 with a frequency of 10 times that of fref 101 for illustration. Divided signals 195-1 and 195-2 are respectively shown with division factors 4 and 2 respectively, thereby satisfying the fixed ratio requirement as an example.

The phase of each divided signal 195 is controlled by offset 106, also received from external sources. Thus, divided signals 195-1 an 195-2 are shown with corresponding offsets Ø1 and Ø2 in relation to a rising edge of fref 101 assuming these offset values are received on 106-1 and 106-2 respectively.

However, there are often scenarios when fref 101 is unavailable, but there is a requirement at least in some environments (such as PLLs in telecom systems) to continue to generate divided signals with similar requirements noted above. For example, a receiving array of time-interleaved Analog to Digital Converters (ADCs) will still require the SYSREF (input reference clock) and Device Clocks (divided signals) at the correct ratio of frequency and more importantly, relative delays between the divided signals from the PLL. Aspects of the present invention operate to provide divided signals even in such scenarios as well, as described below in further detail.

3. Generating Divided Signals

Figure 3:
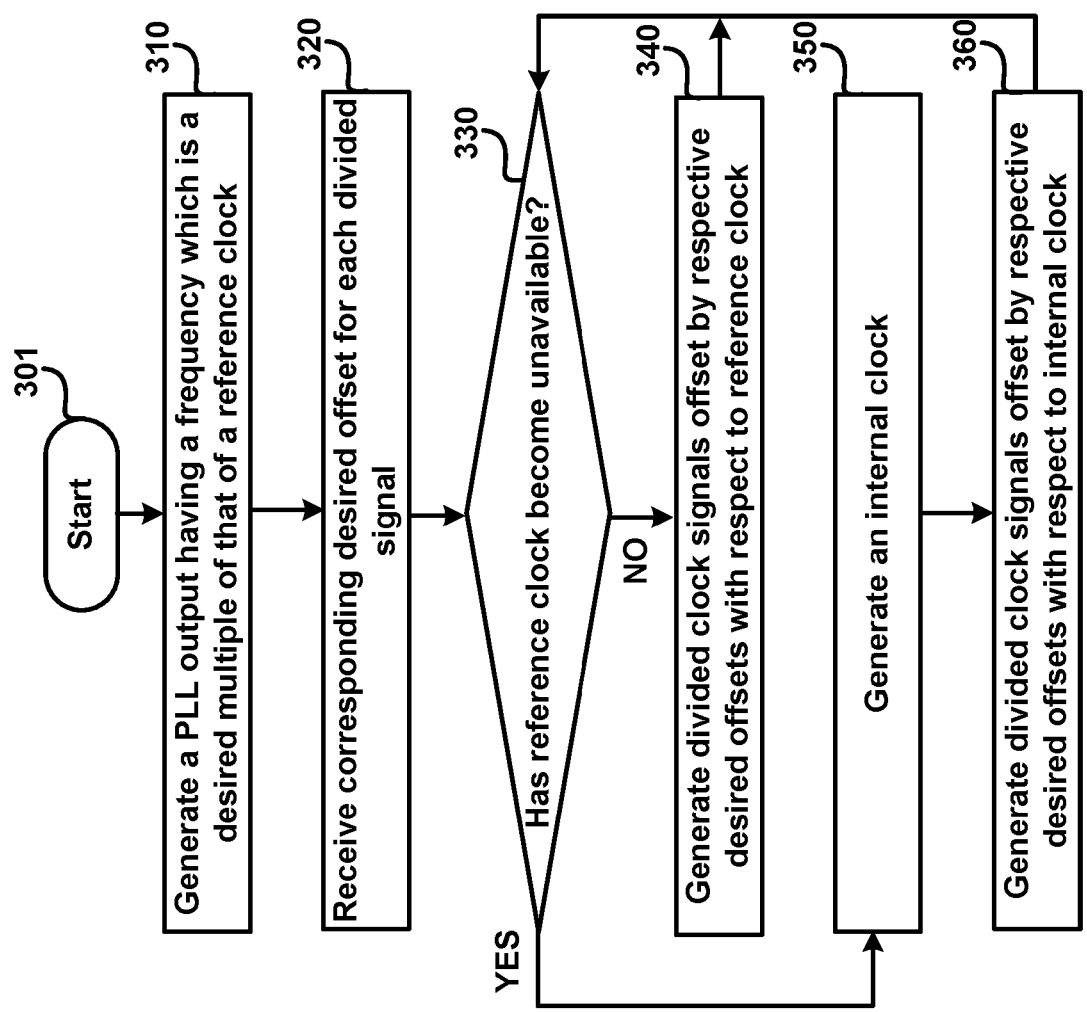
FIG. 3 is a flowchart illustrating the manner in which divided signals are generated, in an embodiment of the present disclosure.

FIG. 3 is a flowchart illustrating the manner in which divided signals are generated according to an aspect of the present disclosure. The flowchart is described with respect to the components of FIG. 1 merely for illustration. However, many of the features can be implemented in other components/systems and/or other environments also without departing from the scope and spirit of several aspects of the present disclosure, as will be apparent to one skilled in the relevant arts by reading the disclosure provided herein.

In addition, some of the steps may be performed in a different sequence than that depicted below, as suited to the specific environment, as will be apparent to one skilled in the relevant arts. Many of such implementations are contemplated to be covered by several aspects of the present disclosure. The flowchart begins in step 301, in which control immediately passes to step 310.

In step 310, PLL 100 generates PLL output 131 having a frequency which is a desired multiple of that of a reference clock 101. In step 320, a corresponding desired offset for each divided signal is received. In step 330, a controller checks whether reference clock 101 has become unavailable, i.e., a previously operative clock signal is now unavailable. Control passes to step 340 if the clock is found to continue to be available and to step 350 otherwise.

In step 340, the divided signals are generated with offset by respective desired offsets with respect to reference clock. Thus reference clock provides a common (time) reference for all the divided signals when the reference clock is available. Control then passes to step 330.

In step 350, an internal clock is generated and in step 360, the divided signals are generated with respective desired offsets with respect to the internal clock. It may be appreciated that the edges of the internal clock provide a common reference for controlling the relative timing of the divided signals. However, other time reference signals (e.g., a set of pulses) can be employed, as suited in the corresponding environments. Control then passes to step 330.

Thus, the approach of FIG. 3 operates to ensure the divided signals (of corresponding desired division factors) are provided at least with relative phase differences maintained, while using another time reference as common reference when the reference clock 101 is unavailable.

It may be observed that the flowchart of FIG. 3 operates under the assumption that a previously operative reference clock signal has become unavailable (for example, after an external reset). However, there can be situations when the reference clock (fref) is unavailable initially, i.e., at the first instance of wake-up of the system containing the PLL. Such a situation may arise, for example, due to a physical disruption in a telecommunication line supplying the reference clock, etc. Aspects of the present disclosure provide divided signals with the pre-specified relative phase delays in such situations as well, as described below with examples.

4. Clock Generation Circuit

Figure 4:
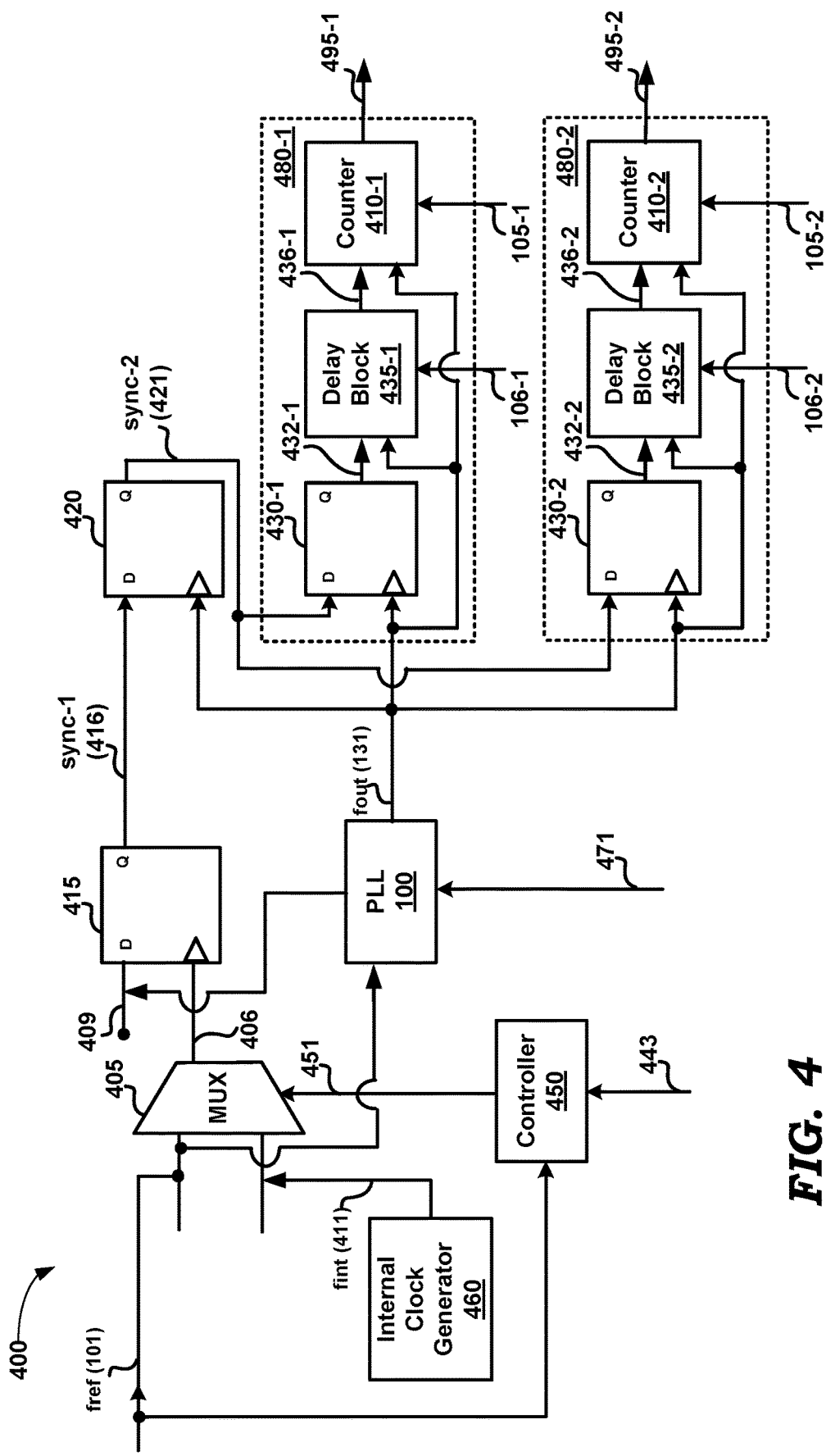
FIG. 4 is a block diagram of a clock generation circuit implemented in an embodiment of the present disclosure.

FIG. 4 is a block diagram of a clock generation circuit implemented according to several aspects of the present disclosure, in an embodiment. Clock generation circuit 400 is shown containing multiplexer (MUX) 405, flip-flops 415 and 420, internal clock generator 460, controller 450, PLL 100, and output-generators 480-1 through 480-2. Each output-generator 480 in turn is shown containing flip-flop 430, delay block 435 and counter 410.

Only representative components (e.g., number of output-generators) are shown for conciseness. The specific blocks/components of clock generation circuit 400 of FIG. 4 are shown merely by way of illustration. Other embodiments of clock generation circuit 400 can be implemented with other blocks/components (analog, digital and/or a combination of analog and digital), as would be apparent to one skilled in the relevant arts by reading the disclosure herein. For example, although blocks 460, 405, 450, 415 and 420 are shown as being implemented external to PLL 100, in alternative embodiments, the blocks may be implemented as part of PLL 100.

Internal clock generator 460 generates a (high-precision and high-stability) internal clock 411 (fint), which is used as described below. Internal clock 411 is used to re-time divided signals upon receipt of a logic high on path 409, as described below. Internal clock 411 may be a series of pulses used to synchronize the divided clocks, or internal clock 411 may be a continuous clock. There are no requirements on the frequency of this clock, as the key aspect is to be able to use this as an event marker to align with suitable relative delay across all the divided outputs from PLL 100.

MUX 405 is shown as receiving input (reference) clock, fref (101) and clock fint (411). MUX 405 forwards one of fref (101) and fint (411) as a common (time) reference on path 406, based on the logic value of select-signal 451. In an embodiment, when the value of select-signal 451 is a logic HIGH, MUX 405 forwards fint (411) as the selected common reference, and fref (101) otherwise.

Controller 450 determines whether or not the reference clock is available on path 101, and controls select-signal 451 to cause fref 101 to be selected when the reference clock is available and fint 411 otherwise. Thus, controller 450 controls the selection of common reference on path 406. In an embodiment, signal 443 is used by external components to indicate the presence of another clock signal (not shown, but would be provided as an input to MUX 405), and controller may control select signal 451 to select such another clock signal as the common reference on path 406. Alternatively, controller 450 might be completely controlled using on-chip internal indicators. In one embodiment, such indicators could be the various clock loss and frequency drift monitors for reference clock 101.

In operation, controller 450 may be pre-programmed to consider fref (101) as a primary clock and fint (411) as a secondary/redundant/back-up clock. Thus, by default (e.g., upon power-up of PLL 100), controller 450 may program the binary value of select-signal 451 to cause MUX 405 to forward fref on path 406. Controller 450 continues to check if fref (101) is functional (and thus available). On determining that fref (101) has failed (is invalid/nonfunctional) controller 450 may program the binary value of select-signal 451 to cause MUX 405 to forward fint on path 406.

Flip-flop 415 is clocked by common reference generated by MUX 405 on path 406. Flip-flop 415 receives a reset signal on path 409 at its D input and generates output (Q), sync-1, on path 416. In an embodiment, flip-flop 415 is implemented as a positive edge triggered flip-flop. Accordingly, flip-flop 415 operates to synchronize reset signal (409) with a first rising edge of fref (101) immediately following the receipt of reset signal on path 409. In this embodiment, reset signal 409 is shown as being received from PLL 100. However, in alternative embodiments, reset signal 409 may also be an external signal that is available from a different reference such as another sub-system on the chip, or an external signal received by the chip.

Similarly, flip-flop 420 operates to synchronize sync-1 (416) with a first edge of fout (131) immediately following the first rising edge of fref (101) noted above. As may be readily observed, the reset signal is forwarded synchronized with the first positive edge following the arrival of the reset signal. The term "immediately following" is used to express such timing relationship.

On the other hand, when a small number of clock cycles (e.g., 2 in the embodiments below) can elapse before the output is provided, the term "closely following" is used instead. In general, given that PLL output 131 operates at a much higher frequency than the reference signal 101 and divided signals 495, the resynchronized signals closely follow the corresponding edge of the common reference.

Each output-generator 480 receives PLL output fout on path 131, sync-2 on path 421 and generates divided signal on corresponding path 495. Flip-flop 430 is clocked by PLL output, and operates to further synchronize sync-2 to fout (131), with the generated signal being provided on path 432. Flip-flop 430 is used to synchronize sync-2 signal received on path 421 with respect to fout (131). This is done to reduce the uncertainty that may be introduced due to routing delays between different output-generators 480. In other words, signal sync-1 may be subject to routing delays and may be received at different times at different output-generators 480. Hence, a second set of synchronization is needed with two flip-flops 420 and 430 that work on signal fout (131) which is typically the highest frequency clock available in the system. Even after synchronizing sync-1 (416) with fout by using flip-flop 420, there exists a possibility that each output-generator 480 may receive sync-2 (421) at different time instances because of routing delays, and accordingly each output-generator 480 may start generating divided signal 495 (after applying the associated offset) asynchronously, thus resulting in not being able to maintain the specified relative phase difference (between divided signals). Using two flip-flops takes care of any such problems. It is also worth noting that the use of a cascade of two flip-flops ensures that there are no metastability issues in the synchronization with respect to clock fout (131). For example, the signal sync-1 (416) may be metastable with respect to fout (131); hence signal sync-1 (416) cannot be sent directly to flip-flops 430 and it is essential to add the single unique flip flop 420.

Delay block 435 delays the signal received on path 432 by a magnitude represented on 106. As delay block 435 is clocked by fout 131, the magnitude may also be converted into a number of clock cycles of fout. The output of the delay block thus represents a timing corresponding to an offset (106) from a specific edge of fout, with the specific edge closely following (2 clock cycles in the example) an edge of the common reference. Delay block 360 may also be implemented in a known way (e.g., using counters, delay lines, RC delay, inverter delay, etc.). In such a case, the delays are not in the unit of cycles of fout (131,) and a more generalized implementation may be employed.

Counter 410 divides the frequency of fout 131 by a desired divisor (which may be integer or fraction). The operation of counter 410 may be viewed as counter 410 counting a number of clock cycles of fout 131 starting from a time instance specified on path 436. When the number equals the integer value received on path 105 (when the divisor is an integer) or when the average number of clock cycles of fout equals the fractional divisor received on path 105 (when the divisor is a fraction), one cycle of the divided signal is deemed to have elapsed. Thus, counter 410 operates to divide the frequency of fout (131) by a desired ratio (based on divide-code 105, specified by user via corresponding means not shown) starting from a time specified on path 436. The generated divided signal (f-div) is provided on path 495.

From the description above, it may be appreciated that reset signal 409 trigger re-timing of the divided clock signals. Though not noted above, reset signal 409 can be used to re-time when reference signal 101 becomes available also (after being unavailable). Reset signal can be used to support operation during a hold-over mode, briefly described below first.

5. Support in Hold-Over Mode

Hold-over mode refers to a duration in which PLL 100 continues to generate PLL output 131 with characteristics similar to those before entering the hold-over mode. Thus, PLL 100 may enter the hold-over mode when fref 101 is unavailable.

In general, in hold-over mode, PLL 100 operates in open-loop mode, in which the oscillator (not shown) inside PLL 100 does not respond to input clock fref 101 (i.e., does not respond to changes in fref 101). The last-known valid state of oscillator (not shown) in PLL 100 is stored and used to continue to generate fout (131). PLL operation in hold-over mode is described in more detail in in U.S. Pat. No. 10,514,720, entitled, "Hitless Switching When Generating an Output Clock Derived from Multiple Redundant Input Clocks".

According to an aspect of the present disclosure, upon entry of hold-over mode, no re-timing is immediately initiated. Rather, PLL 100 generates reset signal 409 only after receipt of external reset on path 471, for example, after PLL 100 is powered-up and reaches steady state. External reset 471 may be generated with, and transition to, appropriate logic levels based on corresponding conventions, and would be well known. Accordingly divided signals are re-timed according to internal clock fint 411 after external reset is received on path 471. The corresponding timing relationships in an embodiment are illustrated below.

6. Timing Relationship when Reference Clock is Unavailable

Figure 5:
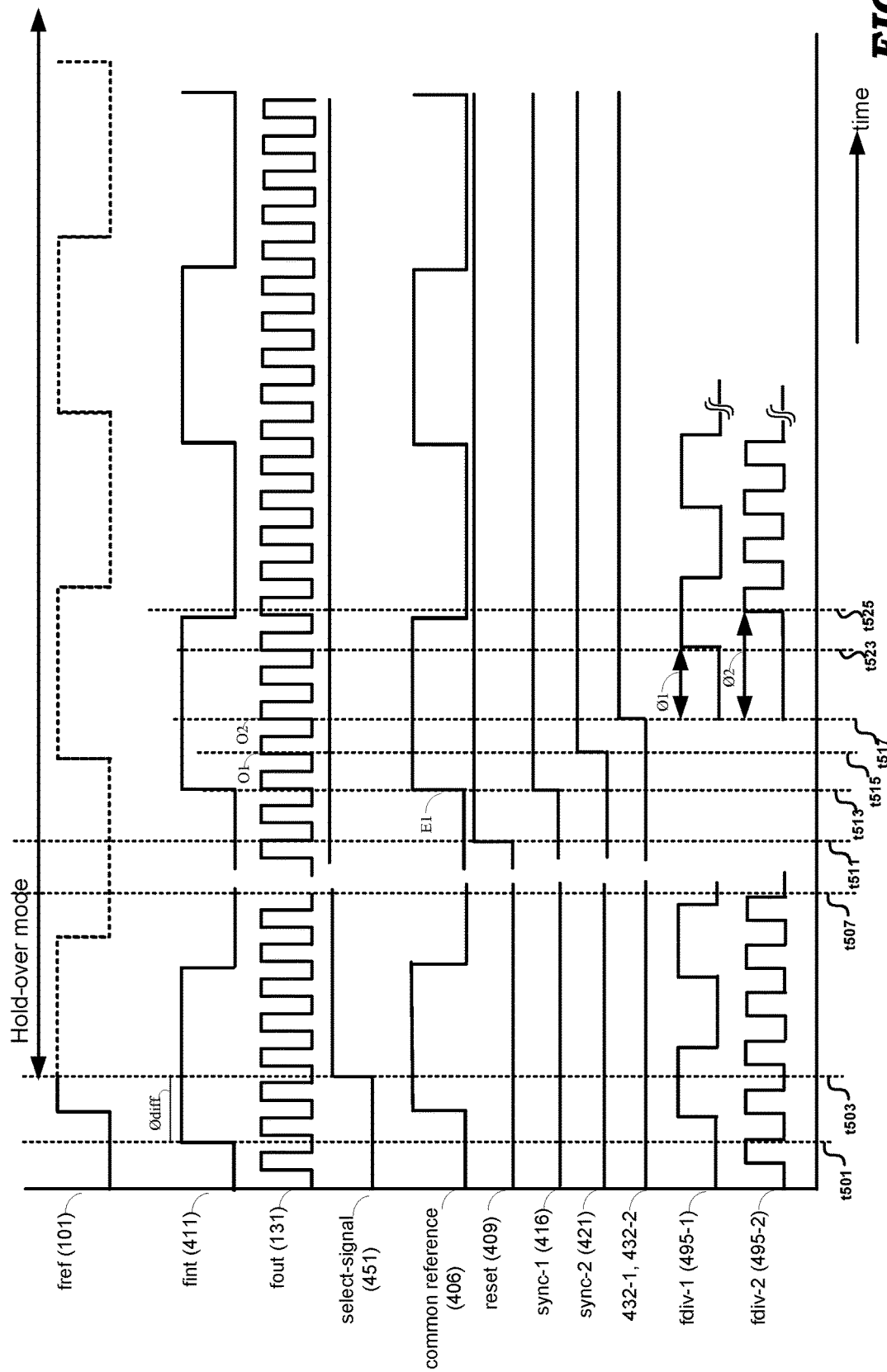
FIG. 5 is a timing diagram illustrating the manner in which divided signals are generated, in an embodiment of the present disclosure.

FIG. 5 is a timing diagram (not to scale) illustrating the manner in which divided signals are generated from PLL output when input clock is unavailable. FIG. 5 shows example waveforms of fref (101), fint (411), fout (131), select-signal (451), common reference (406), first-reset (409), sync-1 (416), sync-2 (421), fdiv-1 (495-1) and fdiv-2 (495-2).

PLL 100 is in steady state until time t501 with or without fref (101) being available (as described below). Thus, prior to t501, select-signal (451) is at logic LOW. Accordingly, clock fref 101 is shown as having been selected as the output of MUX 405 on path 406. Divided signals fdiv-1 (495-1) and fdiv-2 (495-2) are shown as being generated with respective desired (programmed) ratios. Internal clock fint (411) generated by internal clock generator 460 of FIG. 4 is shown as being always ON and available, and having a same frequency as fref (101). However, internal clock fint (411) is shown with a phase shift with respect to fref (101) by phase Ødiff.

Between time t501 and t503, input (reference) clock fref (101) becomes unavailable. Once the clock loss is detected (at t503), PLL 100 is forced to operate in hold-over mode by a component (not shown) internal to PLL 100. In an alternative scenario, clock fref (101) may not be present at all, and hence PLL 100 operates in hold-over state from the start of operation (for example, prior to t501). In such scenarios, since there is no last-known valid state of oscillator, PLL operates using an (internal) oscillator (not shown) to generate PLL output (fout). PLL 100 is shown as operating in hold-over mode starting at time t503. Starting at time t503, fref (101) is indicated by the dotted portion merely to illustrate the phase of fref had it been available.

At t503 (after a finite interval of time after loss of clock fref), controller 450 detects the clock loss. Accordingly, controller 450 generates a logic HIGH on path 451 (select-signal) starting at t503. As a result, clock fint 131 is shown as having been selected as the output of MUX 405 on path 406 from t503.

At t507, it is assumed that PLL 100 is reset by signal received on path 471. A 'reset' may include one or more of a full power cycle (power-down and power-up sequence) of the part containing PLL 100, a hard reset of the chip containing PLL 100, etc. Output-generators 480 are held in reset starting at t507. This time instant can be extended to a case where this was the first wake-up ever of PLL 100 and hence select signal 451 was switched to logic HIGH after this instant once it is realized that input clock fref (101) is not present.

On power-up, since fref 101 is unavailable, PLL 100 operates in hold-over mode as noted above. Also, clock fint 411 is selected as the output of MUX 405 on path 406.

At t511, PLL 100 generates reset signal (asynchronously) on path 409 to release output-generators 480 from reset. Signal 409 is provided to the D input of flip-flop 415. The Q output of flip-flop 415 is the synchronized signal sync-1 (416) (synchronized with a rising edge (E1) of fint occurring at time t513), shown asserted starting at time t513. Sync-1 (416) is forwarded as the D input of flip-flop 420. Accordingly, the Q output of flip-flop 420 is the synchronized signal sync-2 (421), shown asserted starting at time t515 (at the occurrence of the rising edge O1 of fout 131 immediately following edge E1 of fint 411).

Each flip-flop 430 receives sync-2 (421) as the D input, and generates respective Q output on path 432 at t517, synchronized with rising edge O2 of fout, closely following rising edge E1 of fint 411. In other words, an edge of each divided signal is timed to the respective offset immediately after edge O2 of fout (131), where edge O2 closely follows (i.e., by a small number of cycles of fout, e.g., 1-2 clock cycles of fout as depicted in the illustrative embodiment) edge E1 of clock fint (411).

At t517, upon receiving output of flip-flop 430 on path 432, each delay block 435 delays the reset of the corresponding output-generator 480 by the respective pre-determined offset (106). Accordingly, delay block 435-1 delays the release of reset of output-generator 480-1 by offset Ø1 (i.e., till time t523), while delay block 435-2 delays the release of reset of output-generator 480-2 by offset Ø2 (i.e., till time t525).

At t523, delay block 435-1 generates divider-reset on path 436-1 (not shown) to release counter 410-1 from reset. Accordingly, starting at t523, counter 410-1 starts dividing fout (131) by the desired ratio (received on path 105-1).

At t525, delay block 435-2 generates divider-reset on path 436-2 (not shown) to release counter 410-2 from reset. Accordingly, starting at t525, counter 410-2 starts dividing fout (131) by the desired ratio (received on path 105-2).

As noted above, there may be situations where the reference clock (fref) is unavailable initially. In such scenarios, the PLL starts operation in a hold-over mode. However, since there is no last-known valid state of oscillator (generating PLL output), the PLL operates using another (internal) oscillator to generate PLL output (fout), and the divided signals are synchronized to fout (now generated based on another internal oscillator) even if the reference clock is not present.

Once reference clock fref (101) becomes available, all divided signals get synchronized to reference clock (fref). Such an arrangement is typically used in the form of a nested or cascaded architecture of PLLs. It may be appreciated that aspects of the present disclosure provide divided signals that have a fixed and known relative phase delay at every wake-up in such scenarios as well.

According to another aspect of the present disclosure, output-generators of multiple PLLs operating on a common input (e.g., fref 101) may be synchronously released from reset, as will be described next with respect to FIG. 6.

7. Generating Divided Signals of Multiple PLLs

Figure 6:
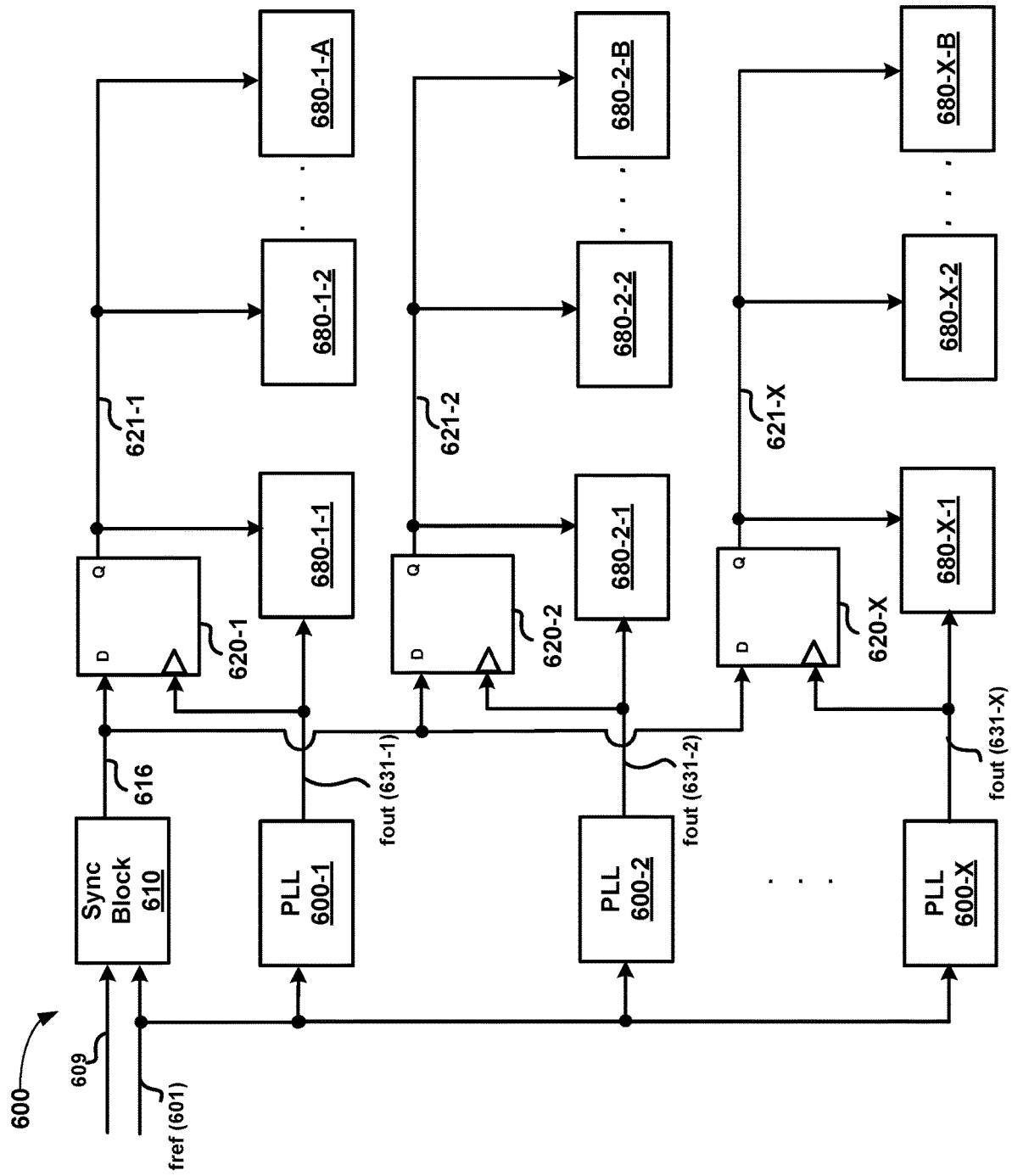
FIG. 6 is a block diagram of a clock generation circuit illustrating the manner in which divided signals are generated for multiple PLLs, in an embodiment of the present disclosure.

FIG. 6 is a block diagram illustrating the implementation details of generating divided signals of a multi-PLL clock generation circuit 600, in an embodiment of the present disclosure. FIG. 6 is shown containing sync block 610, PLLs 600-1 through 600-X, flip-flops 620-1 through 620-X. Each PLL 600 in turn is shown associated with a corresponding set of output-generators 680. Thus, PLL 600-1 is shown associated with output-generators 680-1-1 through 680-1-A, PLL 600-2 is shown associated with output-generators 680-2-1 through 680-2-B, while PLL 600-X is shown associated with output-generators 680-N-1 through 680-N-Y.

Sync block 610 contains components corresponding to blocks 405, 450, 460 and 415 of FIG. 4, and is common to PLLs 600-1 through 600-X. In other words, in the illustrative embodiment depicted in FIG. 6, there is only one instance of sync block 610 for PLLs 600-1 through 600-X. Sync block 610 is shown as receiving signals 609 and fref (601), and generating signal 616. Signal fref (601) corresponds to signal 101 shown in FIG. 4. Sync block 610 also generates internal clock/set of pulses, fint (not shown). Signal 609 represents a common release-from-reset signal, which is asserted to signal release-from-reset only when all PLLs are ready and generating the respective output clocks.

Sync block 610 operates to synchronize signal 609 with fref (601) if present, or to fint, if fref (601) is not present. The selection of fref or fint for synchronization is performed by a multiplexer (inside sync block 610, but not shown in FIG. 6) equivalent to MUX 405 of FIG. 4.

Each PLL 600 operates as PLL 100 of FIG. 4, and would have all the components/blocks of PLL 400 of FIG. 4, except blocks 405, 450, 460 and 415. Each output-generator 680 operates as out-generator 480 of FIG. 4. Flip-flops 520-1 operate in a manner similar to flip-flop 420 of FIG. 4 and the description is not repeated here in the interest of brevity.

Each PLL 600 is shown as receiving fref on path 601, and generating a corresponding PLL output fout on path 631. Signals 631 correspond to signal 131 shown in FIG. 4. As noted above and as depicted in FIG. 6, signal 616 is common across all PLLs. Each PLL 600 synchronizes signal 616 with respect to the respective fout (631) to generate corresponding re-timed signal 621, and the uncertainty between PLLs is reduced to a small number of cycles of the various fout (631). In an embodiment, the small number is 2. As noted above, since signal fout (631) is a very high frequency signal, the relative uncertainty is very small. Signal 621 is in turn used to release respective counters (not shown) in output-generator 680 from reset. In this manner, output-generators of multiple PLLs operating on a common reference (fref or fint) may be synchronously released from reset.

In an embodiment, a controller external to circuit 600 reads the lock status (indicative of PLL having reached the steady state noted above) of each PLL, and sets signal 609 to logic HIGH only after all PLLs have reached steady state. In an alternative embodiment, such operations may be effected by firmware that may be stored in a non-volatile memory within circuit 600.

In an alternative embodiment, multi-PLL clock generation circuit 600 of FIG. 6 is implemented by replicating clock generation circuit 400 of FIG. 4 as many times as the number of PLLs in circuit 600. A common sync block 610 is not implemented. In the embodiment, each of such replicated circuits 400 could be ready and generating the corresponding output clock asynchronously with respect to each other. Therefore, fref (601), even if available, is temporarily blocked inside each of the replicated circuits 400 following every external reset (including first wake-up) indicator (such as 471 of FIG. 4) until such time as when all the PLLs have become ready and generating respective output clocks. Similarly, internal clock fint of each replica circuit 400 is also blocked for such duration. Blocking of signals fref and fint in each replica circuit 400 may be implemented in a known way (e.g., by using switches in the input paths to the multiplexer.

In an alternative scenario, fref may continue to be blocked (despite being available), and divided signals of all PLLs may be synchronized to internal clock (or set of pulses), fint, noted above. This may be useful at least in some environments where it is required that divided signals across multiple PLLs be synchronized to a common reference other than fref. Such an objective may be achieved, for example, by controlling select signal of equivalent MUX 405 in a known way.

It may be appreciated that since the individual PLLs wake-up (initialize and reach steady state) in a sequence (and not all together), blocking fref (601) and fint in each replica circuit 400 until all PLLs reach steady state ensures that the relative alignment between the divided signals across different PLLs is maintained across resets. In the absence of such blocking, each PLL upon wake-up would have started generating the corresponding divided signals, and therefore the divided signals from the multiple PLLs would not start synchronous to each other, but at different time instances.

The above technique ensures that for a multi-PLL system, the input reference clock (even when it is present) can be blocked inside the chip to emulate a loss of clock and this arrangement can be used to ensure that the output-generators are released together or with a known phase difference even when they are from different PLLs. This provides a unique use case where the divided signals across PLLs can be aligned or provided at known relative delays even for the cases where the input reference clocks are present. This is useful for cases where the PLLs are enabled (reach a steady state) in a sequence such that if the input reference clock was present all the time, the output-generators would start producing the divided signals as soon as the PLL is enabled.

With this scheme, the output-generators will wait for the common internally generated reference to start the output dividers (counters).

Clock generation circuit 400/600 implemented as described above can be incorporated in a larger device or system as described briefly next.

8. System

Figure 7:
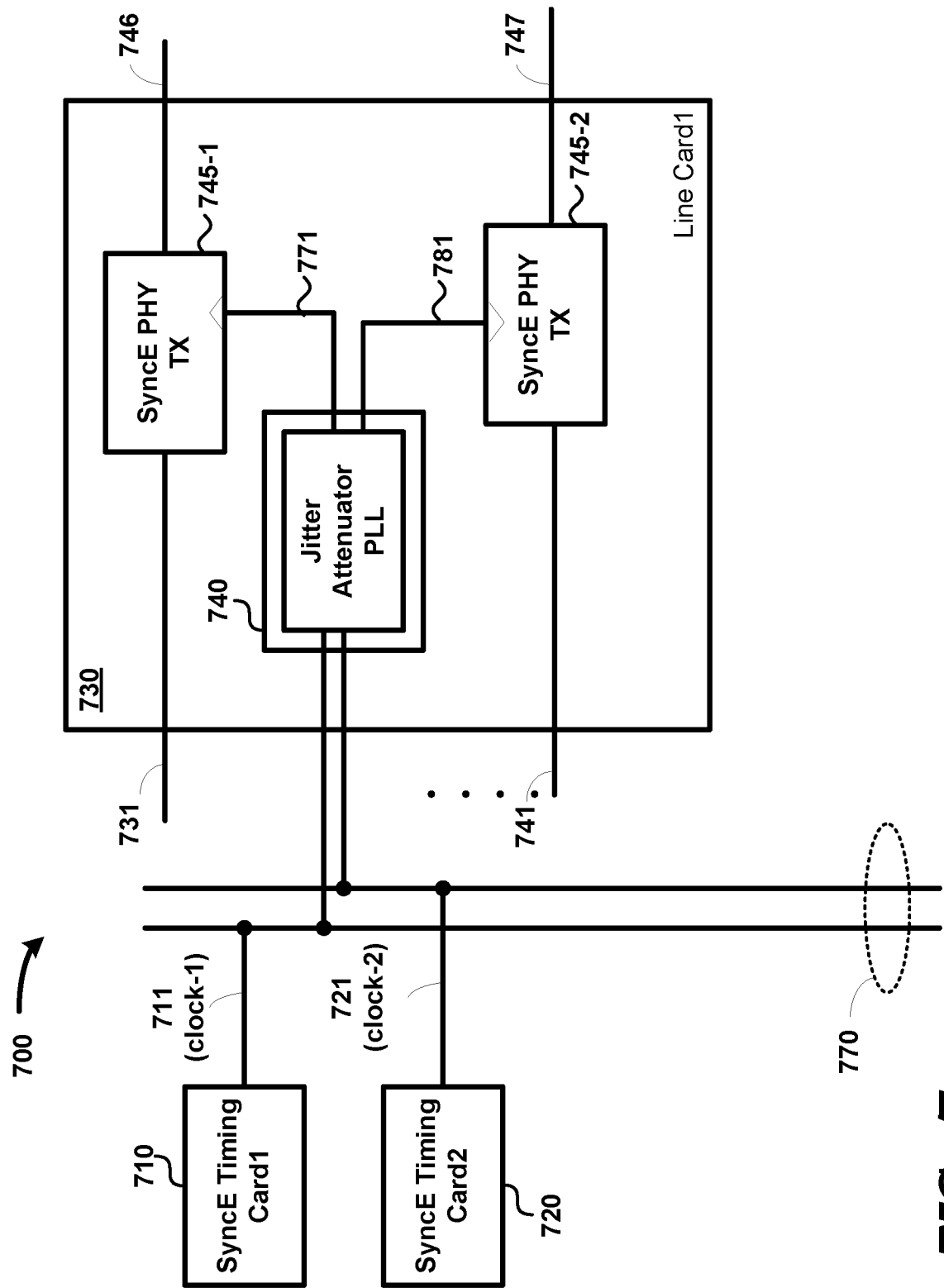
FIG. 7 is a block diagram of a system in which a device implemented according to several aspects of the present disclosure can be incorporated, in an embodiment of the present disclosure.

FIG. 7 is a block diagram of an example system containing a PLL implemented according to various aspects of the present disclosure, as described in detail above. System 700 is shown containing SyncE (Synchronous Ethernet) timing cards (710 and 720) and line cards 1 through N, of which only a single line card 730 is shown for simplicity. Line card 730 is shown containing jitter attenuator PLL 740 and SyncE PHY Transmitters 745-1 and 745-2. The components of FIG. 7 may operate consistent with the Synchronous Ethernet (SyncE) network standard. As is well known in the relevant arts, SyncE is a physical layer (PHY)-based technology for achieving synchronization in packet-based Ethernet networks. The SyncE clock signal transmitted over the physical layer should be traceable to an external master clock (for example, from a timing card such as card 710 or 720). Accordingly, Ethernet packets are re-timed with respect to the master clock, and then transmitted in the physical layer. Thus, data packets (e.g., on path 731 and 741) are re-timed and transmitted without any time stamp information being recorded in the data packet. The packets may be generated by corresponding applications such as IPTV (Internet Protocol Television), VoIP (Voice over Internet Protocol), etc.

Thus, line card 730 receives data packets on paths 731 and 741, and forwards the respective packets on outputs 746 and 747 after the packets are re-timed (synchronized) with a master clock.

The master clock (711/clock 1) is generated by timing card 710. Timing card 720 generates a redundant clock (721/clock-2) that is to be used by line cards 730 and 750 upon failure of master clock 711. Master clock 711 and redundant clock 721 are provided via a backplane (represented by numeral 770) to each of lines cards 730 and 750.

In line card 730, jitter attenuator PLL 740 may be implemented as clock generation circuit 400 described above in detail, and receives clocks 711 and 721, with outputs of a pair of output-generators connected respectively to SyncE PHY Transmitters 745-1 and 745-2. PLL 740 generates output clocks 771 and 781, which are used to synchronize (re-time) packets received respectively on paths 731 and 741, and forwarded as re-timed packets on paths 746 and 747. Any specified relative phase difference between outputs on paths 746 and 747 may be repeatably maintained across resets of line card 730 even when clocks 711/721 become unavailable. Another example is the case of an array of data converters such that 745-1 and 745-2 are two data converters that need the clocks to have a similar relative phase difference.

9. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1, 4, 6 and 7, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

Accordingly, in the instant application, the power and ground terminals are referred to as constant reference potentials, the source (emitter) and drain (collector) terminals of transistors (though which a current path is provided when turned on and an open path is provided when turned off) are termed as current terminals, and the gate (base) terminal is termed as a control terminal.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A method of generating divided signals, said method comprising:
   generating, using a phase locked loop (PLL), a PLL output having a frequency which is a desired multiple of that of a reference clock;
   receiving a corresponding desired time offset of a plurality of time offsets associated with each divided signal of a plurality of divided signals;
   dividing said PLL output by a respective divisor of a plurality of divisors to generate a corresponding divided signal of said plurality of divided signals, wherein each divided signal is offset from a common reference by at least said associated desired time offset; and
   selecting said reference clock or said time reference signal as said common reference in response to a select signal being in a first state or a second state respectively, wherein said select signal is in said first state when said reference clock is available and is in said second state when said reference clock is not available,
   wherein said time reference signal is generated external to said reference clock.

2. The method of claim 1, wherein a first edge of each divided signal is timed to said associated time offset immediately after a first edge of said PLL output, said first edge of said PLL output closely following a first edge of said reference clock when said reference clock is available; and
   wherein a second edge of said each divided signal is timed to said associated time offset immediately after a second edge of said PLL output, said second edge of said PLL output closely following a second edge of said time reference signal when said reference clock is not available.

3. The method of claim 2, wherein said dividing comprises counting a number of clock cycles of said PLL output from a first time instance at which a divider reset signal is received.

4. The method of claim 3, wherein generating said divider reset signal comprises:
   synchronizing a first reset signal with said common reference to generate a first synchronized signal;
   synchronizing said first synchronized signal with said PLL output to generate a second synchronized signal; and delaying said second synchronized signal by said associated time offset to set said first time instance,
wherein said first state of said select signal is a logic low and said second state of said select signal is a logic high.

5. The method of claim 4, wherein said PLL operates in a hold-over mode when said reference clock is not available, wherein said hold-over mode entails said PLL continuing to generate said PLL output without using said reference clock,
wherein said first reset signal is generated upon receiving an external reset signal after said PLL is operating in said hold-over mode at least for some duration.

6. The method of claim 5, wherein said each divided signal is offset from said common reference by said associated desired time offset plus a small number of cycles of said PLL output.

7. A clock generation circuit for generating divided signals, said clock generating circuit comprising:
a phase locked loop (PLL) generating a PLL output having a frequency which is a desired multiple of that of a reference clock;
a divider circuit for dividing said PLL output by a respective divisor of a plurality of divisors to generate a corresponding divided signal of a plurality of divided signals, wherein said corresponding divided signal is offset from a common reference by at least an associated desired time offset; and
a multiplexer to select said reference clock or said time reference signal as said common reference in response to a select signal being in a first state or a second state respectively, wherein said select signal is in said first state when said reference clock is available and is in said second state when said reference clock is not available,
wherein said time reference signal is generated external to said reference clock.

8. The clock generation circuit of claim 7, wherein a first edge of each divided signal is timed to said associated time offset immediately after a first edge of said PLL output, said first edge of said PLL output closely following a first edge of said reference clock when said reference clock is available, and a second edge of said each divided signal is timed to said associated time offset immediately after a second edge of said PLL output, said second edge of said PLL output closely following a second edge of a time reference signal when said reference clock is not available.

9. The clock generation circuit of claim 8, wherein said divider circuit comprises:
a counter to start counting a number of clock cycles of said PLL output from a first time instance at which a divider reset signal is received to generate said divided signal.

10. The clock generation circuit of claim 9, further comprising a synchronization circuit to generate said divider reset signal at said first time instance, said synchronization circuit comprising:
a first flip-flop to synchronize a first reset signal with said common reference to generate a first synchronized signal;
a second flip-flop to synchronize said first synchronized signal with said PLL output to generate a second synchronized signal; and
a delay block to delay said second synchronized signal by said associated time offset to set said first time instance,
wherein said first state of said select signal is a logic low and said second state of said select signal is a logic high.

11. The clock generation circuit of claim 10, wherein said PLL operates in a hold-over mode when said reference clock is not available, wherein said hold-over mode entails said PLL continuing to generate said PLL output without using said reference clock,
wherein said first reset signal is generated upon receiving an external reset signal after said PLL is operating in said hold-over mode at least for some duration.

12. The clock generation circuit of claim 11, further comprising an internal clock generator to generate an internal clock signal as said time reference signal.

13. The clock generation circuit of claim 10, wherein said each divided signal is offset from said common reference by said associated desired time offset plus a small number of cycles of said PLL output.

* * * * *